US010262832B2

(12) United States Patent
Danilatos

(10) Patent No.: US 10,262,832 B2
(45) Date of Patent: Apr. 16, 2019

(54) WIDE FIELD ATMOSPHERIC SCANNING ELECTRON MICROSCOPE

(71) Applicant: Gerasimos Daniel Danilatos, New South Wales (AU)

(72) Inventor: Gerasimos Daniel Danilatos, New South Wales (AU)

( * ) Notice: Subject to any disclaimer, the term of this patent is extended or adjusted under 35 U.S.C. 154(b) by 0 days.

(21) Appl. No.: 15/749,900

(22) PCT Filed: Aug. 16, 2016

(86) PCT No.: PCT/AU2016/050757
§ 371 (c)(1),
(2) Date: Feb. 2, 2018

(87) PCT Pub. No.: WO2017/027922
PCT Pub. Date: Feb. 23, 2017

(65) Prior Publication Data
US 2018/0226221 A1    Aug. 9, 2018

(30) Foreign Application Priority Data
Aug. 18, 2015   (AU) .................................. 2015903332

(51) Int. Cl.
*H01J 37/20*    (2006.01)
*H01J 37/28*    (2006.01)
*H01J 37/147*   (2006.01)

(52) U.S. Cl.
CPC .......... *H01J 37/28* (2013.01); *H01J 37/1472* (2013.01); *H01J 37/1474* (2013.01); *H01J 37/20* (2013.01);
(Continued)

(58) Field of Classification Search
CPC .... H01J 37/1472; H01J 37/1474; H01J 37/20; H01J 37/28; H01J 2237/188;
(Continued)

(56) References Cited

U.S. PATENT DOCUMENTS 4,897,545 A    1/1990  Danilatos
5,250,808 A *  10/1993 Danilatos .............. H01J 37/244
                                                    250/310
(Continued)

OTHER PUBLICATIONS

International Search Report PCT/AU2016/050757 dated Oct. 25, 2016.
(Continued)

*Primary Examiner* — David E Smith
(74) *Attorney, Agent, or Firm* — Pillsbury Winthrop Shaw Pittman, LLP

(57) ABSTRACT

Atmospheric scanning electron microscope achieves a wide field of view at low magnifications in a broad range of gaseous pressure, acceleration voltage and image resolution. This is based on the use of a reduced size pressure limiting aperture together with a scanning beam pivot point located at the small aperture at the end of electron optics column. A second aperture is located at the principal plane of the objective lens. Double deflection elements scan and rock the beam at a pivot point first at or near the principal plane of the lens while post-lens deflection means scan and rock the beam at a second pivot point at or near aperture at the end of the optics column. The aperture at the first pivot may act also as beam limiting aperture. In the alternative, with no beam limiting aperture at the principal plane, maximum amount of beam rays passes through the lens and with no post-lens deflection means, the beam is formed (limited) by a very small aperture at or near-and-below the final lens while the aperture skims a shifting portion of the wide beam, which is physically rocked with a pivot on the principal plane but with an apparent pivot point close and above the aperture, all of which result in a wide field of view on the examined specimen.

19 Claims, 3 Drawing Sheets

(52) U.S. Cl.
CPC . *H01J 2237/188* (2013.01); *H01J 2237/2003* (2013.01); *H01J 2237/2605* (2013.01); *H01J 2237/2608* (2013.01); *H01J 2237/2803* (2013.01); *H01J 2237/2806* (2013.01); *H01J 2237/2807* (2013.01); *H01J 2237/2808* (2013.01); *H01J 2237/2811* (2013.01)

(58) Field of Classification Search
CPC ....... H01J 2237/2003; H01J 2237/2605; H01J 2237/2608; H01J 2237/2803; H01J 2237/2806; H01J 2237/2807; H01J 2237/2808; H01J 2237/2811
See application file for complete search history.

(56) References Cited

U.S. PATENT DOCUMENTS

| | | | |
|---|---|---|---|
| 5,362,964 A | 11/1994 | Knowles et al. | |
| 5,828,064 A * | 10/1998 | Knowles | H01J 37/244 250/310 |
| 6,590,210 B1 | 7/2003 | Essers | |
| 6,809,322 B2 | 10/2004 | Danilatos | |
| 8,405,045 B2 * | 3/2013 | Preikszas | H01J 37/1474 250/396 ML |
| 2008/0073534 A1 * | 3/2008 | Katane | H01J 37/244 250/310 |

OTHER PUBLICATIONS

Written Opinion of the International Searching Authority PCT/AU2016/050757 dated Oct. 25, 2016.

\* cited by examiner

WIDE FIELD ATMOSPHERIC SCANNING ELECTRON MICROSCOPE

CROSS-REFERENCE TO RELATED APPLICATIONS

This application is the U.S. National Phase of PCT/AU2016/050757 filed Aug. 16, 2016, which claims priority to Australian Patent Application No. 2015903332, filed Aug. 18, 2015, the contents of each are incorporated herein by reference in entirety.

TECHNICAL FIELD

The present invention relates to the technical field of electron and ion microscopy as well as to electron and ion beam technologies in general.

BACKGROUND ART

Electron microscopes in general and scanning electron microscopes (SEM) in particular use an electron beam probe to examine specimens. The electron beam requires a good vacuum, where it is generated by an electron gun source and propagated through focussing lenses all the way to the specimen. In addition, many of the detection means used to detect the emerging signals from the beam-specimen interaction also require a vacuum condition, in which, however, the specimen is severely limited. In the past, this meant that only dehydrated specimens could be used. In addition, because the electron beam delivers an electric current, the specimen should generally have a conductive surface to prevent accumulation of charge that hinders normal operation of the instrument. This meant that generally insulating surfaces could not be examined. However, the more recent technology of environmental scanning electron microscopy (ESEM) has made it possible to examine specimens in a gaseous environment. The presence of a gaseous envelope around the specimen at sufficient pressure makes it possible to maintain moist conditions so that hydrated specimens can be observed in their natural state. Also, the ionised gas dissipates the electron beam current away from the surface of insulating specimens and, therefore, these specimens need not have the pre-treatments conventionally used to render their surface conductive. Furthermore, the gas is used as detection medium to detect the signals propagated and amplified in the gaseous envelope around the specimen. Such signals are usually the secondary electrons (SE) and the backscattered electrons (BSE) from the specimen, which ionise the surrounding gas and amplify the signal that is processed by appropriate means to form and display images or sprectra. However, certain disadvantages on the field of view need still to be overcome.

A particular prior art by U.S. Pat. No. 6,809,322B2 patent provides, among other disclosures and advantages, the possibility of using a relatively small pressure limiting aperture (PLA) without restricting the field of view. The basis of claims for the said art is the employment of beam deflection elements, all of which are confined between two PLAs; one aperture (PLA1) is located at the end of the electron optics column, while the beam is rocked by said deflection elements with a pivot point at or near the plane of PLA1. However, the claim of the necessity to locate and confine all deflection elements between the said two PLAs imposes certain limits on the scope, performance and industrial applicability.

Another particular prior art by U.S. Pat. No. 5,362,964, among other claims, provides also two PLAs but with two beam deflection elements located before the beam enters the space between the two PLAs plus a third deflection element located between the two PLAs. The first aperture (PLA1) is located at the end of the electron optics column, whilst the second aperture (PLA2) together with the third deflection element are located inside a magnetic lens with reduced focal length. The said third deflection element in combination with the magnetic lens field deflect and rock the beam with a pivot point at or near the plane of PLA1, so that the beam scans a large field of view at the specimen plane. However, the latter combination or configuration has posed a serious doubt on its practical feasibility and industrial applicability; notably, the full life of that patent has expired without any laboratory tests published or any commercial implementation.

Yet another prior art by U.S. Pat. No. 8,405,045B2 patent also provides multiple sets of deflection elements to achieve a large field of view at the specimen level: The beam is rocked with a pivot point at a final aperture, which, however, is clearly located inside the objective lens at or near its principal plane for the purpose of preventing electron beam aberrations and preserve resolution and usability. However, the latter location of the pivot point imposes a serious limitation on the scope and performance in the presence of a gaseous environment in an ESEM type of instrument, which requires the placement of a PLA1 at the end of the electron optics column for optimum performance. The latter requirement has not yet been achieved industrially since the inception and commercial exploitation of ESEM technology.

DISCLOSURE OF INVENTION

The object of the invention is to disclose an atmospheric scanning electron microscope with a generally wide field of view at the specimen plane by novel means, which overcome the limitations of prior art. This provides for the examination of specimens under elevated pressure of any gas with practically no electron beam loss above a small aperture located at the end of an electron optics column. It relates with prior art of ESEM but the newly improved field of view at low magnification combines with improved resolution at high magnification, improved pumping capacity and improved signal detection and imaging of any specimen placed in a gaseous environment. We refer to the present novel device as wide field atmospheric scanning electron microscope, or WFASEM for short.

In one aspect of the invention, there is disclosed a device using charged particle optical means (optics column) for the generation and propagation of a focussed charged particle beam transferred via a series of at least two apertures from a high vacuum column into a high pressure gaseous environment in the specimen chamber. Independent pumping is provided between consecutive apertures to obtain the vacuum level as required by various components of the column. The beam is directed from its source (e.g. an electron or ion gun) through the optics column to the specimen under examination. The gas surrounding the said specimen flows in the opposite direction of beam propagation, namely, form the specimen chamber towards the beam source. This gas flow is intercepted and minimised by the provided pumping means in stages between apertures that limit the gas flow and pressure along the axis (said apertures also referred to as pressure limiting apertures, or PLA for short); in agreement with prior terminology, counting of said apertures is in the direction of gas flow starting from the end of the column. Now, a series of three sets of deflection elements counting in the direction of beam propagation is provided as follows: First deflection element forces the beam away from its optical axis, whilst second deflection element forces the beam back to cross the axis and continue again away from the axis. A third deflection element finally forces the beam back to cross the axis again at a second point and then to continue until the beam strikes the specimen away from the axis. The second beam-axis crossing point is located at or near the first aperture (PLA1), which is located at the end of the column on a separate housing below the final lens. The first beam-axis crossing point is located at or near the second aperture (PLA2). The optics column also necessitates the inclusion of spray apertures along the beam propagation to eliminate stray scattered electrons and one beam forming or beam limiting aperture (BLA), which defines the beam spot size in a given optics column; initially, the PLA2 can act also as BLA. The deflection power of the corresponding elements is variable and synchronised in such a manner as to scan the beam over the specimen surface in any desired manner and size. The maximum scanned size defines the field of view for each magnification, so that based on the known principles of SEM, the maximum field of view corresponds to the minimum magnification. By such means, the following technical advantages are obtained: The beam is deflected at a considerable distance on the specimen away from the axis. The beam aberrations are minimised to achieve the highest possible resolution. Minimum size apertures are possible to employ, which minimises the amount of gas leak through the column. Pumping requirements are minimal. Beam loss due to scattering by gas above the PLA1 is practically eliminated. Maximum beam current is then available to traverse the remaining gas layer above the specimen, which maximises the scope of the device.

In the preferred embodiment, the charged particle beam is an electron beam giving rise to an environmental or atmospheric scanning electron microscope with an enlarged field of view. The actual size of field of view at maximum deflection is determined by the distance of the examined specimen from the aperture, which is known and termed as environmental distance (ED). The field of view is then proportional to ED at a given beam deflection. At the lower range of pressures, the specimen can be placed relatively far from the PLA1 and the field of view is maximal. As the pressure is raised in the specimen chamber, ED becomes shorter with concomitant reduction of the field of view but nevertheless remaining much larger than the diameter of PLA1. In any case, the field of view is not obstructed (vignetted) by the PLA1 in the manner of existing commercial ESEM type instruments, but only by the electron optics characteristics as in conventional SEM.

In practical terms, the inventive steps of the present invention are materialised in the preferred embodiments by (a) placing two scanning (deflection) elements in a pre-lens (objective lens) configuration with a third scanning (deflection) element in a post-lens configuration; (b) scanning the beam by rocking it first around a pivot point preferably at or near the principal plane of the objective lens and secondly around a pivot point at or near the end of the column; (c) a first PLA1 being placed at or near the second pivot point at the end of the column and a second PLA2 being placed at or near the first pivot point; (d) the size of PLA1 being the smallest possible without interfering with the beam formation and (e) adjusting the electron optics components to operate at optimum efficiency, such as including but not limited to dynamic stigmator and dynamic focussing means to eliminate remaining beam aberrations and achieve the smallest possible useful beam probe.

An alternative or variable but simpler configuration to obtain the same object of the invention, namely, a large field of view in a gaseous atmosphere, utilises the field force of the final lens without requiring the combined (concurrent) use of a third deflection element, which has been impractical to implement by prior art of U.S. Pat. No. 5,362,964. Now, the previous said housing below the lens is replaced by a very small aperture diaphragm fitted directly at or near the bottom of the final lens without the previous evacuation path, also without the third deflection element and without a prior beam limiting aperture in the column, while the incident beam is rocked only at the principal plane of the lens. Due to the short focal length and the small size of PLA1, the beam spot is now formed (limited) by skimming (in other words screening, or sampling) a fraction of beam rays as the broad (unformed) beam sweeps over the small aperture; for the extended field of view thus obtained, there is an apparent pivot point much closer to the PLA1, whilst the true (physical) pivot point remains on the principal plane.

A further embodiment of the present invention anticipates the option of a variable position of any of the said pivot points by adjusting the power in the deflection elements.

Imaging is obtained by a system of electrodes in a gaseous detection device (GDD) configuration that separate the secondary from the backscattered electrons. X-ray microanalysis (energy dispersive spectroscopy—EDS) is obtained by a suitable detector that fits close to and subtends a substantial solid angle above the specimen. The latter becomes possible by utilising needle or wire electrodes for imaging to free space for the EDS detector.

These and further objectives of the invention will become apparent from the following description of the preferred embodiments of the present invention as illustrated in the accompanying drawings.

BEST MODES FOR CARRYING OUT THE INVENTION

To assist with understanding of the invention, reference will now be made to the accompanying drawings, which embody some examples of the invention.

Figure 1:
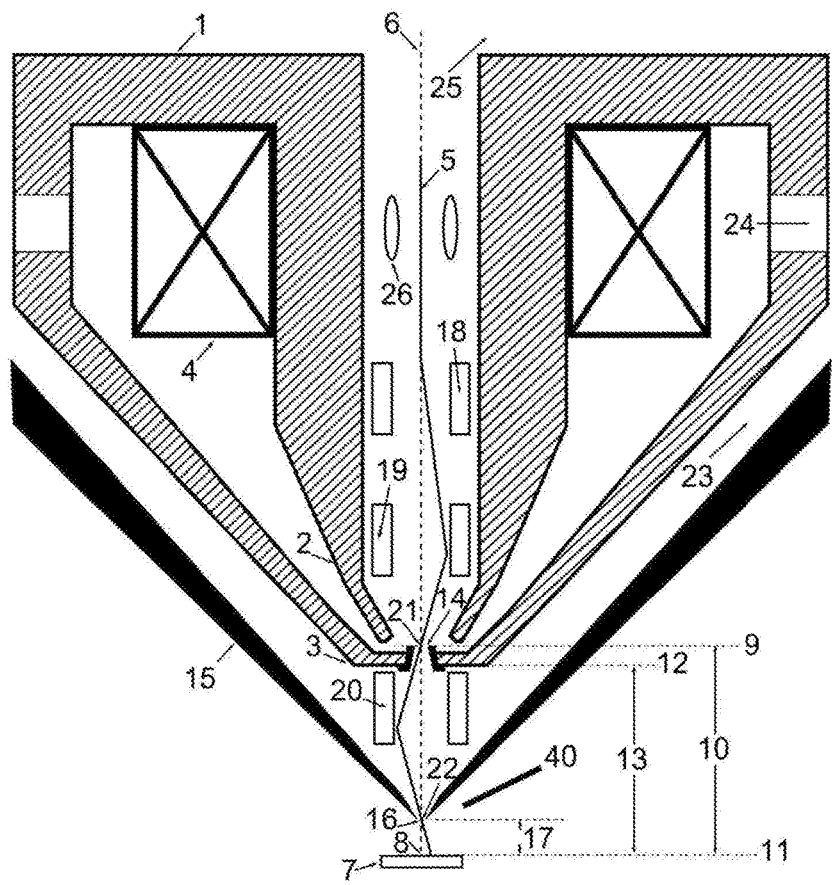
FIG. 1 Diagram of the final lens of an electron optics column with two electron beam deflection elements and a dynamic stigmator, encased and terminated from below with a generally conical housing bearing a small final aperture at its apex and enclosing a third deflection element; specimen is at a short distance below the final aperture, while it is scanned by an impinging electron beam initially traveling on the axis of the lens.

One embodiment of a device of the present invention is shown in FIG. 1. An electron beam is generated, focussed and scanned by an electron optics column by known means, the relevant parts only of which are drawn. The final lens of the column is a magnetic lens (1) having an upper pole piece (2), a lower pole piece (3), electric current wire windings (4) to generate a magnetic flux in the body of the lens resulting in an axially symmetric magnetic field in the gap between pole-pieces (2) and (3). The magnetic field acts as a focussing lens of the electron beam (5) initially propagating along the axis (6) of the system. The beam strikes the specimen (object) (7) under examination initially at the axis point (8). The magnetic lens is characterised by its principal plane (9) located in the gap of pole-pieces at a distance (10) from the plane of the specimen. The specimen is at distance (13) from the bottom (12) of lens, which is known as working distance (WD). An aperture (14) is formed at the principal plane by a non-magnetic material diaphragm that fits in the bore of the lens. A further non-magnetic material housing (15) generally conically shaped encloses the lens from below with an aperture (16) at its bottom. The distance (17) of the last aperture from the specimen is known as environmental distance (ED). Now, in order that a substantial surface area of the specimen can be examined and imaged, the beam is scanned in a raster form by means of deflection elements. However, the alignment of the generally small apertures (14) and (16) restricts the amplitude of scanning as practised by prior art and hence the field of view is limited by the size of aperture (16). This limitation is now overcome by a system of three deflection elements (18), (19) and (20). By the first deflection element (18) the beam moves away from the axis, whilst by the second deflection element (19) the beam moves back and crosses the axis at point (21) at the principal lens plane (9) inside the aperture (14). After crossing, the beam moves away from the axis again, but by force of the third deflection element (20) it returns to cross the axis at a second point (22) inside the aperture (16), after which it strikes the specimen at a significant distance away from the axis. All three deflection elements are synchronised so as to achieve a continuous scanning raster over the specimen surface. By this device configuration, it is possible to allow a gaseous environment around the specimen, which otherwise should be a vacuum, while enough of the electron beam survives to form a probe at the specimen in the usual manner. This is achieved by apertures (16) and (14) acting as pressure limiting apertures (PLA), because the generally small amount of gas leaking through the first pressure limiting aperture (16) (PLA1) is pumped out of the system via the space (23) provided; any remaining gas that leaks through the second pressure limiting aperture (14) (PLA2) is then efficiently pumped out via symmetric holes (24) in the outer lens wall and/or via the exiting passage (25) through the inner space of the lens. Detection means (40) are inserted preferably on the side of conical housing (15) as described subsequently.

In the preferred embodiment of FIG. 1, the third deflection element (20) appears enveloped entirely by housing (15) with gas flow around it, but the same element may be placed entirely outside the housing (15) by reshaping and proper choice of materials for (15) to allow the magnetic field through a diamagnetic housing. Likewise, the element (20) can be physically connected with the housing (15) in any manner that allows gas to flow in the direction (23). Any integration of element (20) with housing (15) should allow a PLA1 to protrude at the end of the assembly so that detection means can be inserted around without obstructing the environmental distance ED (17).

The above type of lens is used only to assist with the description of the overall invention without exhausting other details required for a most efficient electron optics design, such as the incorporation of dynamic focussing and/or dynamic stigmator (26). However, reference should be made to the use of additional apertures in the optics column to serve either as PLAs for further differential pumping to obtain the best vacuum required in the electron beam source chamber, or for other requirements of the beam optics itself; additional apertures used are spray apertures to eliminate scattered stray electrons, or bores in electrodes and lenses to form, or limit and focus the beam.

One special aperture is used as probe forming or beam limiting aperture (BLA) by allowing only the central core of the beam to pass, whilst blocking (i.e screening out) the outer electrons. This determines the formation of a particular spot size of the beam (or probe) at the specimen plane with a given beam current and given beam source at a given accelerating voltage. Said BLA is placed at any convenient position along the axis inside, or prior, or in the vicinity of the final lens to facilitate other technical requirements. A typical placement of the BLA is at the principal plane of the lens where the beam is rocked around the pivot point (21), i.e. the BLA can coincide with the PLA2 (14); however, it can also be placed before or after the lens field for specific purposes without restricting the scope of this invention. To better describe the role of the BLA in the present invention, reference is now made to FIG. 2. The electron beam (5) propagating downwards is shown first as nearly parallel (actually slightly diverging) vertical lines (or rays) clustered around the axis and representing individual electrons. The lines falling inside the BLA (also PLA2) (14) are allowed to pass through the lens, whilst the outside ones finish their trajectories at the lens and BLA diaphragm walls. Diagrammatically, the electron rays (lines) converge after they cross the principal plane of the lens to a focussed spot (8) on the axis at the object (specimen) plane (11). The beam thus focussed is then deflected and rocked around the pivot points inside (14) and (16) as described in FIG. 1, so that it scans and rasters a relatively large area, the extent of which defines the field of view (FoV) and the magnification of this area being displayed on the image screen of the instrument. In this BLA configuration, the PLA1 is a little larger than the diameter of the converging pencil of electrons at the PLA1 plane, so as not to interfere any further with the formation of the focussed pencil of beam rays.

Figure 2:
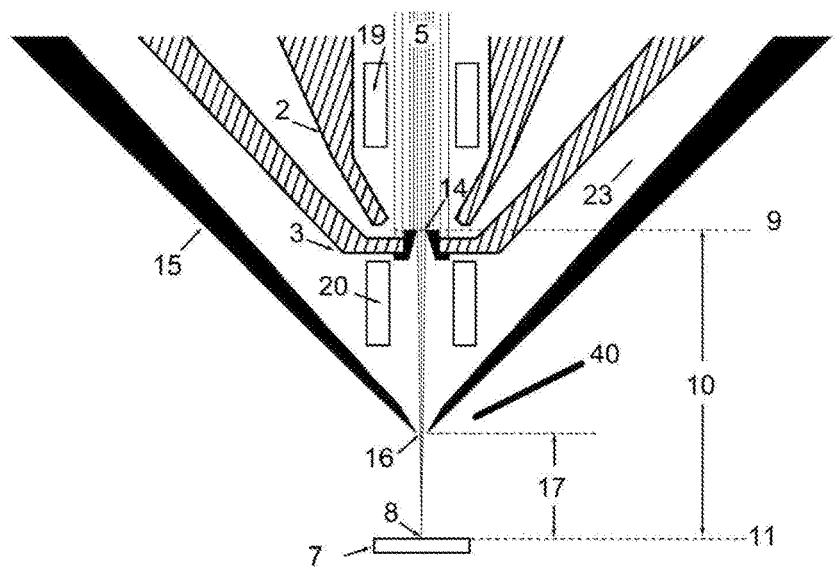
FIG. 2 Diagram of an enlarged view of the bottom portion of FIG. 1 showing the electron beam as a bundle of rays, the central core of which converges to a focussed spot at the specimen.
Figure 3:
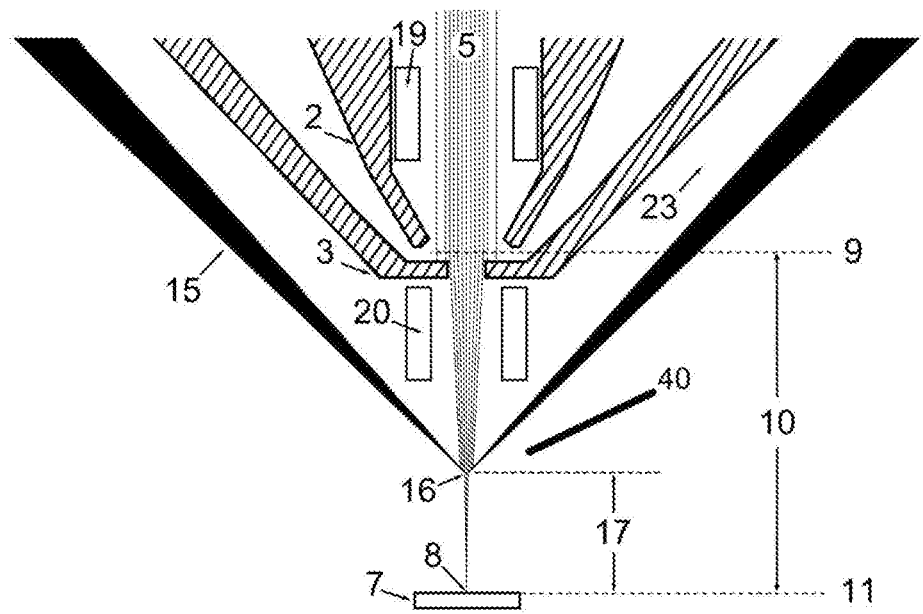
FIG. 3 Same diagram as FIG. 2 except that the beam limiting diaphragm in the lens has been removed to allow the final pressure limiting aperture to act also as beam limiting aperture.

In an alternative BLA configuration, another embodiment is shown in FIG. 3 where the previous diaphragm (14) of FIG. 1 or 2 has been removed altogether, whilst PLA1 has been reduced in size to allow the same amount of electron rays through itself as the amount of rays that was determined to pass through (14) in the previous FIG. 2. By such means, PLA1 (16) acts also as BLA in the same way as PLA2 was combined with BLA previously. Notably, the depth of focus is the same in both configurations of FIGS. 2 and 3 by proper choice of BLA (i.e. also PLA1) size in inverse proportion to its distance from the principal plane; the depth of focus is determined by the angle subtended by the BLA at the specimen (or the same, subtended by its image on the principal plane). Whilst this configuration has the advantage of one less aperture, it has also the disadvantage of higher probability of contamination of the BLA with adverse effects (e.g. astigmatism). However, this is an intermediate possible design to understand the inventive step of this invention in another configuration that follows. By way of FIG. 3, as the ED (17) becomes smaller, the focussed beam spot contains more from the previously blocked rays with no adverse effects as long as those rays are about of the same consistency as the core rays of the beam. By yet further decrease of ED, more peripheral rays of lesser density and focus enter the aperture and create a hazy annular halo around an ever decreasing circle of a clear image ultimately limiting the practical use at or very close to the PLA1.

In yet a further complementary embodiment of this invention provided in FIG. 4, the previous outer housing (15) and the third deflection element (20) of FIG. 3 are removed, whilst a new diaphragm with aperture (30) is placed at or immediately below (a short distance from) the bottom of pole-piece (3) of the lens. By such means, the lens can acquire a very short focal length of only a few mm below the lens and several mm below its principal plane. The upper deflection elements (18) and (19) remain the same to scan and rock the beam at the pivot point on principal plane (9) as previously. The un-deflected beam spot (probe) at point (8) on the specimen is formed by the BLA (30) diaphragm blocking (screening out) most of the outer beam rays. However, it has been found that those outer rays can still be utilised at the lowest magnification requiring an extended field of view; by scanning, the beam spot is formed on the specimen by utilising or skimming gradually those outer rays of the beam, with a spot size being consistent with the minimum resolution required at the lowest magnifications. The rays are drawn as straight lines inside the lens and converge to point (27) for simplicity, but they are actually curved by the lens field and extend to an even greater field of view with an apparent pivot point much closer to the PLA1 (30). Thus, the maximum deflection angle is assisted by the action of the field of the lens having a short focal length. This configuration allows control of the BLA size to obtain an optimum angle of the converging beam pencil from the principal plane, which yields the smallest possible spot size by any given type of electron source. Typical optimum aperture angles range between 5-10 mrad. Due to the very short working distance, the corresponding BLA/PLA1 is generally very small too; typical sizes range between 30-100 μm, so that by use of the smallest possible value, the BLA can also serve as PLA1 allowing the smallest possible gas leak. As a result, the pumping provided through the lens openings (24) can be sufficient to obtain the required electron optics vacua. This advantage can be absent in configurations of FIGS. 1, 2 and 3 on account of the longer working distance imposed by the incorporation of the third scanning element between PLA1 and PLA2. In other words, both the minimum spot size and the minimum gas leak could be at a disadvantage in previous configurations, but not in FIG. 4.

Figure 4:
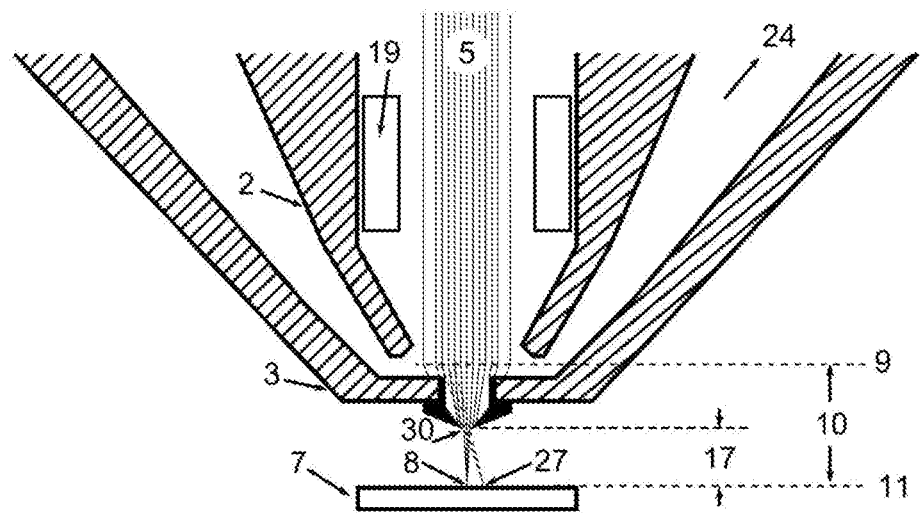
FIG. 4 Enlarged view of the lower part of the lens without an external housing, whilst both the pressure limiting aperture and the beam limiting aperture are integrated in one single diaphragm fitted immediately below the lower polepiece of the lens; aperture skims a variable portion of scanned electron rays being rocked at the principal plane of the lens.

Having regard to the advantages of design in FIG. 4, we must also point out first the disadvantages and then propose means to overcome them. There is a minimum distance (17) that allows un-impeded imaging with FIG. 4; for shorter distance, the PLA1/BLA skim the outermost rays that form a hazy and blurred annular halo around the central clear image, which eventually overwhelms and makes the image unusable. A typical numerical example is by use of a 50 μm PLA1/BLA with the minimum usable ED (17) being about 1.5-2.0 mm, while the extended field of view is greater than about 1 mm. There is an already practical advantage by this example, whereby with such a small PLA1 the FoV is so relatively great. The low limit in ED can still be overcome by using an even smaller PLA1/BLA in proportion with a smaller ED. Thus, with PLA1/BLA diameter of only 12.5 μm (i.e. a factor of 4 less than 50 μm), the corresponding limit for ED becomes about 0.5 mm, at which the FoV is more than about 250 μm, which is also greatly enhanced in comparison with the 12.5 μm PLA1 that would be the FoV in all prior art configurations. Notwithstanding this advantage, it would not be possible to focus the beam all the way onto the PLA1 as the previous FIGS. 1, 2, and 3 allow to do, but this can be restored in FIG. 4 by providing means for an optional insertion of a BLA at some convenient location above the PLA1. The net advantage of FIG. 4 is the lowest possible pumping requirements with such an extremely small size of PLA1 possible and a concomitant best beam transfer.

In variant forms of the invention, the deflection elements (18), (19) and (20) can be made from coil windings or saddle windings with a magnetic field deflection, or from electrodes with an electric field deflection.

In another configuration, the magnetic lens can be replaced with an electrostatic lens, whereby the magnetic field is replaced by an electric field also comprising a principal plane (9) as in FIG. 1.

Various combinations of magnetic and electric lenses together with magnetic or electric deflection elements can form various embodiments of the invention.

Any of the above disclosed beam optics assembly requires a minimum number of pumps to remove all the gas continuously leaking through the PLA1 (16) by pressure differential stages. Said pumps can be connected either in parallel exhausting independently to atmosphere, or preferably in series with each pump exhausting at the inlet of the preceding pump or stage. Said continuous gas leak can be supplied either from the atmosphere in an open-ended system, or from exhausting the gas out of the column in the specimen chamber by recirculation.

The generally conical housing or equivalent protruding geometric structure allows for the placement of the specimen as close as possible to the PLA1, namely, reducing the environmental distance (ED) to a minimum required in order to minimise the electron beam losses in the gas and increase overall instrument performance. This also frees space for the placement of various detectors around the conical shape without restricting the positioning and size of specimens. Specifically with reference to FIG. 4, the aperture (30) should be placed as close as possible to the bottom of the lens in order to increase the field of view but allow only the shortest distance to fit the required detectors. The latter requirement would be best served if the conical lens pole-piece is truncated as close as possible to the rim the PLA1/BLA. Below are provided variations of preferred detection means (40) that are compatible with the column designs disclosed in FIGS. 1, 2, 3 and 4.

In yet another particular embodiment of the present invention that, in one sense, may be in continuation to prior art U.S. Pat. No. 6,809,322 B2 (by DANILATOS), the aperture 16 of FIG. 1 is shifted to a position whereby all deflection elements 18, 19, and 20 are substantially contained between the two apertures 14 and 16 but without affecting the three off-axis deflections of the beam and without shifting the rocking point from the principal plane near position 21. Prior art may still use two pivot points, namely, one at the principal plane and one at the PLA1, but it has not specifically required positioning of the beam pivot point at or near the principal plane of the lens. Maintaining the rocking point at or near the principal plane is critical and important with regards to achieving minimal beam aberrations, which was not obvious, or anticipated, or disclosed by said prior art. Maintaining the second aperture (PLA2) at the principal plane together with the rocking point is important with regards to achieving minimum electron beam losses by way of minimum travel distance and minimum aperture diameter for minimum beam scattering by leaking gas; any other position of PLA2 necessitates a larger diameter to avoid vignetting of the field of view. Therefore, by FIG. 1 herewith, we achieve optimum operating conditions overall in ways not obvious or anticipated by prior art. However, by shifting PLA2 to increase the inter-aperture distance, the increased beam losses may be acceptable in a subset of industrial applications. In the latter case, it should be appreciated that the exact location of the shifted PLA2 that is opted for practical design purposes does not depart from the spirit of the invention, because any position between the above described extremes results in variation only of the beam losses that can be industrially acceptable for all practical purposes. Hence, this particular embodiment is generally independent of prior art, except that it is contingent on and in continuation of prior art U.S. Pat. No. 6,809,322 B2 in the special case where all deflections are substantially located between PLA1 and PLA2. Hence, shifting of the PLA2 along the beam axis does not depart from the spirit of this invention.

Figure 5:
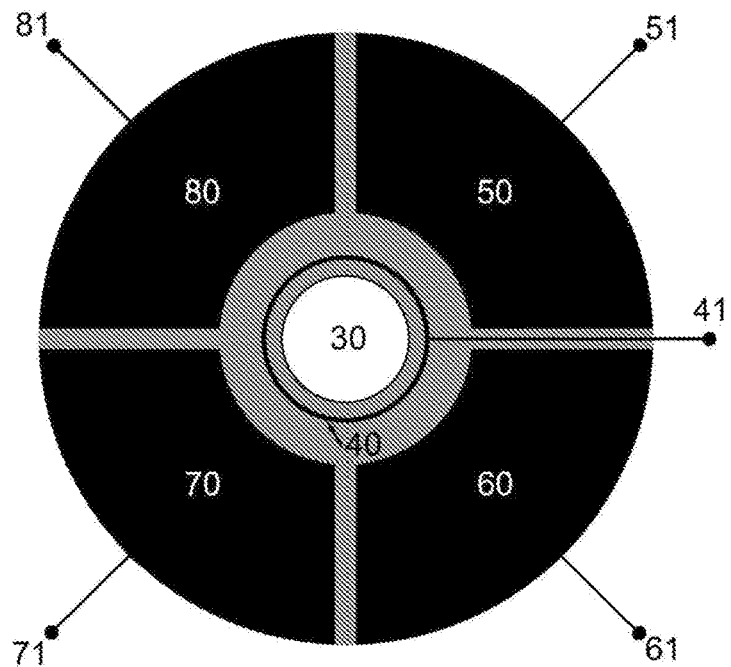
FIG. 5 Plan view of a ring shaped secondary electron detector near the rim of the pressure limiting aperture together with four annular quadrants of backscattered electron detectors in one embodiment of the gaseous detection device (GDD).

Now, any of the above beam optics designs is purported to obtain information from the beam-specimen interaction in the form of images or spectra as in energy x-ray dispersive spectroscopy (EDS or EDX) and analysis. FIG. 5 shows detection means in plan view from the bottom of any of the previous diagrams. In one form, the PLA1 (30) is surrounded in close proximity by a ring electrode (40) connected via an insulated conductive path (31) to follow-up electronics leading to the image display; this serves to obtain secondary electron (SE) images via the well-known gaseous detection (discharge) device (GDD). In another form, the latter electrode is surrounded by four quadrants (50), (60), (70) and (80) of plate electrodes in an annular formation, which are connected by corresponding conductive paths (51), (61), (71) and (81) to follow-up electronics leading likewise to the image display; this serves to obtain four different components of backscattered electron (BSE) images via the GDD principles. By algebraically summing various fractions of the four BSE components, images are composed showing atomic number contrast, or topographic contrast with illumination from any direction; said contrasts can be obtained on either separate grey images or superimposed in colour composition images.

The above GDD can be based on the use of the ionisation of the environmental gas by various signals, or the scintillation accompanying the same ionisation of the gas.

Figure 6:
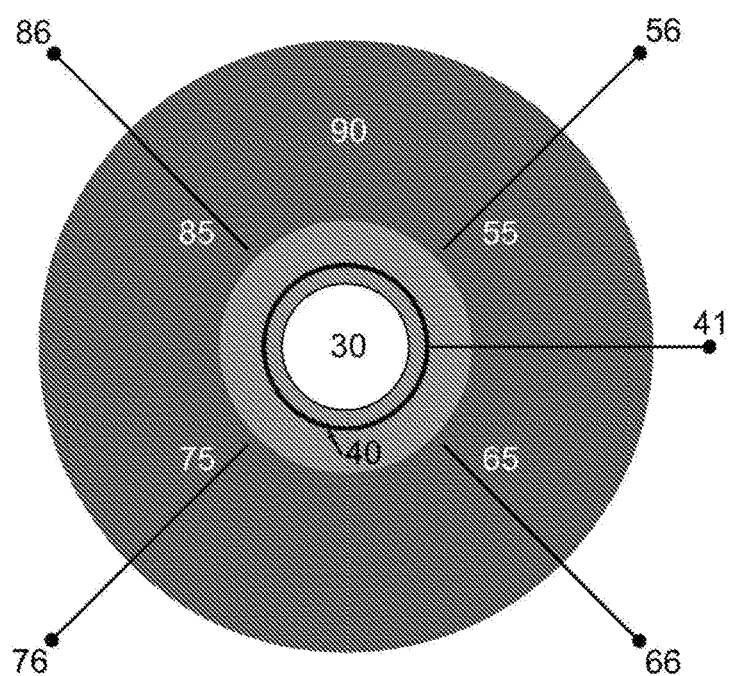
FIG. 6 Plan view of a ring shaped secondary electron detector as in FIG. 5 surrounded by an annular x-ray detector, in front of (below) which are four wire electrodes for the detection of backscattered electrons in another embodiment of the GDD.

In order to free space for the incorporation of x-ray detection, FIG. 6 shows a modification to previous FIG. 5 by reducing the four BSE quadrant detectors to simple exposed wires (or needles) (55), (65), (75) and (85) connected to the same electronics at (56), (66), (76) and (86). By such means, the space freed immediately above said four BSE wires is now occupied by an x-ray detector (90) (also known as EDS), which is annular in shape to maximise the x-ray collection angle, but it can have any other convenient shape and position for all practical purposes and other x-ray requirements.

The preferred detectors described above in FIGS. 5 and 6 do not limit the use of other detector types, e.g. for cathodoluminescence, that can be integrated or built around the electron optics column of this invention. Different shapes of electrodes of the GDD detector, like wire frames and wire grids to define separate detection gaseous volumes, solid state detectors for BSE signals, light pipes and light sensitive devices, like photomultipliers and photodiodes can be equally employed.

Whereas for convenience in the preferred embodiments described hereinabove frequent reference was made to the use of an electron beam, the same or similar embodiments can incorporate any other charged particle beam, like ion beams already used elsewhere.

It should be appreciated that FIGS. 1, 2, 3, 4, 5 and 6 do not restrict the scope and design of the present invention. Various parameters can vary to obtain different information in different applications. It will be apparent to those skilled in the art that various changes and modifications may be made therein without departing from the spirit of the invention.

It should also be appreciated that the scope of the present invention is not limited by the particular type of electron optics used to implement the teachings herewith. Generally speaking, the existing electron optics designs can be integrated with the disclosures of this invention. However, better and improved results are obtained by re-designing the existing electron optics to optimally accommodate the disclosures of the present invention and such optimization will not be construed as departing from the spirit of the present invention.

Any particular embodiments of the teachings of the present inventions via various electron optical designs does not depart from the scope and spirit of the invention.

The needle or other shape of GDD electrode can also be used inside a magnetic or electric field arising either from the focussing action of lenses or from the purposeful introduction of electromagnetic field sources to further control the electrons and ions generated inside the gaseous volume of the detector.

Again, it will be apparent to those skilled in the art that various changes and modifications may be made therein to allow a combination and integration with other instruments without departing from the spirit of the invention.

INDUSTRIAL APPLICABILITY

The conventional SEM is severely limited to the examination of specimens in vacuum, whereas the present invention allows the examination of specimens in a gaseous atmosphere close to their natural environment. However, provision of a wide field of view at low magnifications has been restricted in existing commercial ESEM type instruments and it would be an important advantage to restore this feature as in conventional SEMs.

The novel WFASEM disclosed by the present invention has the said advantage coupled with optimised resolution, minimum beam energy and pumping requirements. These and other advantages provide a strong inventive in all related industries.

Another advantage is the minimal loss of beam during transfer from the vacuum electron optics into the high pressure environment. Because a much smaller pressure limiting aperture is deliberately used in the embodiments of the present invention, the supersonic gas jet formed above the aperture is significantly smaller and hence significantly less electron or ion beam losses occur in the region above the aperture as opposed to the situation in prior art, which has elected the use of rather large apertures with adverse effects. The lesser beam losses are also obtained by the better vacuum achieved along the electron beam path, which, in turn, improves the signal-to-noise-ratio.

Another advantage is the higher pressure range that can be tolerated in the specimen chamber, because of the better separation of the vacuum electron optics from the specimen chamber, which, in turn, presents minimal pumping requirements.

The embodiments of the present invention apply generally to all instruments using a charged particle beam such as an electron and ion beam probe, which is generally scanned over a specimen surface. Such instruments comprise scanning electron microscopes, scanning transmission electron microscopes, electron beam micro-analysers, environmental scanning electron microscopes and ion/electron beam instruments as used in microelectronics industry for microfabrication. Electron beams are generated with different types of electron gun such as tungsten, lanthanum hexaboride and field emission gun. Likewise, the focussing of the beam is achieved with different type of electric or magnetic lenses. In any or all of these industrial applications, incorporation of the present disclosures will not be considered as a departure from the spirit of the present invention, but as an industrial applicability of the present invention.

Patent Literature

U.S. Pat. No. 5,362,964, 1994, Knowles et al.
U.S. Pat. No. 6,809,322 B2, 2004, Danilatos
U.S. Pat. No. 8,405,045 B2, 2013, Preikszas et al.

The invention claimed is:

1. A device using charged particle optical means for the generation and propagation of a charged particle beam focussed by a final lens on a specimen inside a gaseous atmosphere stage that is separated from the high vacuum stage of the particle beam source via a series of apertures separating consecutive pressure stages with differential pumping and characterised in that:
(a) said beam is deflected and scanned by first and second deflection means so that the beam is rocked with a first pivot point preferably at or near the principal plane of the said lens, while it is further deflected and scanned by third deflection means so that the said beam is further rocked with second pivot point situated after the beam exits the said lens; and
(b) a first aperture is placed at or near the said second pivot point and a second aperture is placed at or near the said first pivot point, wherein said apertures restrict the flow of gas between said consecutive stages while permit the passage of said beam; and
(c) said third deflection means is located after the principal plane of said final lens in the direction of propagation of said charged particle beam; or characterized in that:
(d) said beam is deflected and scanned by first and second deflection means so that the beam is rocked with a pivot point preferably at or near the principal plane of the said lens; and
(e) an end-aperture is placed at or near-and-below the said final lens wherein the aperture restricts the flow of gas from specimen stage while permits the passage and limits the spot size of said beam; and
(f) said end-aperture having a smaller diameter than said beam skims a shifting portion of the scanned beam to form a small probing spot over a wide area of said specimen.

2. A device according to claim 1 wherein any of said apertures or an optionally additional aperture along the path of the beam acts as beam limiting aperture to form a small probing spot.

3. A device according to claim 1 wherein said second aperture is removed or made large to allow the said first aperture to act as beam limiting aperture to form a small probing spot.

4. A device according to claim 1 wherein said deflection of beam is assisted by the field force of the said lens at short focal lengths.

5. A device according to claim 1 wherein said lens is magnetic or electric and said deflection means are magnetic or electric.

6. A device according to claim 1 wherein said specimen is placed in an open or enclosed atmosphere.

7. A device according to claim 1 wherein said pumping means are connected in parallel to pump independently said stages while exhausting to open atmosphere.

8. A device according to claim 1 wherein said pumping means are interconnected in series to pump said stages while a pump exhausts at the consecutive stage or consecutive pump inlet.

9. A device according to claim 1 wherein said pumping means are interconnected in series to pump said stages while a pump exhausts at the consecutive stage or consecutive pump inlet; and wherein a continuous gas leak through said first aperture from the specimen chamber is replenished by recirculation of exhausting gas from the column.

10. A device according to claim 1 wherein secondary electrons, backscattered electrons, cathodoluminescence, or x-rays emitted from the specimen are detected by suitable means.

11. A device according to claim 1 wherein secondary and backscattered electrons emitted from the specimen are detected by a gaseous detection device based on the ionisation or scintillation of the environmental gas by the signals emerging from the specimen.

12. A device according to claim 1 wherein secondary and backscattered electrons emitted from the specimen are detected by a gaseous detection device consisting of one or more wire or needle electrodes, or one or more plate electrodes, or consisting of a combination of wires, needles and plate electrodes.

13. A device according to claim 1 wherein a gaseous detection device is placed outside the housing of the said charged particle optical means.

14. A device according to claim 1 wherein a gaseous detection device is placed inside the housing of the said charged particle optical means.

15. A device according to claim 1 wherein the said electron optics comprises known art such as dynamic stigmator and dynamic focussing means to deliver maximum beam current in the minimum probe spot size, or such as a beam limiting aperture that is separate from the said apertures, or electromagnetic shielding and other state of the art components.

16. A device according to claim 1 wherein the second said aperture is placed substantially away from the said first pivot point, while the first pivot point is maintained at or near the principal plane of the lens.

17. A method or mode of operation of an atmospheric scanning electron microscope using an electron optics column for the generation and propagation of a beam focussed by a final lens on a specimen inside a gaseous atmosphere stage that is separated from the high vacuum stage of the beam source via a series of apertures separating consecutive pressure stages with differential pumping and characterised in that:
- (a) said beam is deflected and scanned by first and second deflection means so that the beam is rocked with a first pivot point preferably at or near the principal plane of the said lens while it is further deflected and scanned by a third deflection means so that the said beam is further rocked with second pivot point situated after the beam exits the said lens; and
- (b) a first aperture is placed at or near the said second pivot point and a second aperture is placed at or near the said first pivot wherein said apertures restrict the flow of gas between said consecutive stages while permit the passage of said beam.

18. A method or mode of operation of an atmospheric scanning electron microscope using an electron optics column for the generation and propagation of a beam focussed by a final lens on a specimen inside a gaseous atmosphere stage that is separated from the high vacuum stage of the beam source via a series of apertures separating consecutive pressure stages with differential pumping and characterised in that:
- (a) said beam is deflected and scanned by first and second deflection means so that the beam is rocked with a pivot point preferably at or near the principal plane of the said lens; and
- (b) an end-aperture is placed at or near-and-below the said final lens wherein the aperture restricts the flow of gas from specimen stage while permits the passage and limits the spot size of said beam; and
- (c) wherein said aperture, while having a smaller diameter than said beam, skims a shifting portion of the scanned beam to form a small probing spot over a wide area of said specimen; and
- (d) wherein said deflection of beam is assisted by the field force of said lens at short focal lengths.

19. A method or mode of operation of a device according to claim 18 wherein the position of any of said pivot points is adjustable along the axis of the said optics column.

* * * * *